(12) United States Patent
Peng et al.

(10) Patent No.: US 10,822,865 B2
(45) Date of Patent: Nov. 3, 2020

(54) NOISE REDUCTION DOOR

(71) Applicant: Huawei Technologies Co., Ltd., Shenzhen (CN)

(72) Inventors: Yaofeng Peng, Hangzhou (CN); Zhixin Li, Shenzhen (CN); Changye Jia, Shenzhen (CN); Shengmei Wu, Shenzhen (CN); Rong Chen, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 461 days.

(21) Appl. No.: 15/814,071

(22) Filed: Nov. 15, 2017

(65) Prior Publication Data

US 2018/0073294 A1  Mar. 15, 2018

Related U.S. Application Data

(63) Continuation of application No. PCT/CN2016/076269, filed on Mar. 14, 2016.

(30) Foreign Application Priority Data

Aug. 31, 2015  (CN) ........................ 2015 1 0547600

(51) Int. Cl.
*E06B 5/20* (2006.01)
*H05K 7/20* (2006.01)
*H04Q 1/02* (2006.01)

(52) U.S. Cl.
CPC .............. *E06B 5/20* (2013.01); *H04Q 1/025* (2013.01); *H04Q 1/026* (2013.01); *H04Q 1/11* (2013.01); *H05K 7/20736* (2013.01)

(58) Field of Classification Search
CPC ....... H04Q 1/11; H04Q 1/025; H05K 7/20736
(Continued)

(56) References Cited

U.S. PATENT DOCUMENTS

| 7,866,440 B2* | 1/2011 | Douglas ................. B64D 33/02 181/210 |
| 2006/0118356 A1* | 6/2006 | Beeson ..................... E06B 7/08 181/287 |

(Continued)

FOREIGN PATENT DOCUMENTS

| CA | 2053818 A1 | 4/1993 |
| CN | 2497025 Y | 6/2002 |

(Continued)

OTHER PUBLICATIONS

Machine Translation and Abstract of Chinese Publication No. CN2497025, Jun. 26, 2002, 4 pages.

(Continued)

Primary Examiner — Forrest M Phillips
(74) Attorney, Agent, or Firm — Conley Rose, P.C.

(57) ABSTRACT

A noise reduction door related to a noise reduction device in order to resolve a problem that the noise reduction door cannot meet a requirement for different noise reduction effects and different air duct resistance. The noise reduction door includes a T-shaped mechanical part, two fan-shaped mechanical parts, and a door plate. The T-shaped mechanical part and the fan-shaped mechanical part are connected to the door plate using a detachable connection mechanical part. The T-shaped mechanical part is located on a central axis of the door plate, and the two fan-shaped mechanical parts are respectively located on two sides of the T-shaped mechanical part. Therefore, the fan-shaped mechanical part on the door plate may be changed to have different installation positions and installation manners in order to obtain noise reduction doors in different forms. The embodiments of the present disclosure are applied in cabinet noise reduction.

20 Claims, 8 Drawing Sheets

(58) Field of Classification Search
USPC .......................................................... 181/210
See application file for complete search history.

(56) References Cited

U.S. PATENT DOCUMENTS

| | | | |
|---|---|---|---|
| 2015/0376848 A1* | 12/2015 | Corbin, Jr. | ............ E01F 8/0023 |
| | | | 181/210 |
| 2017/0030140 A1* | 2/2017 | Nelson | ....................... E06B 5/20 |
| 2018/0066429 A1* | 3/2018 | Yau | ....................... E04F 13/075 |

FOREIGN PATENT DOCUMENTS

| | | | |
|---|---|---|---|
| CN | 2854031 | Y | 1/2007 |
| CN | 101397878 | A | 4/2009 |
| CN | 202759697 | U | 2/2013 |
| CN | 104317368 | A | 1/2015 |
| CN | 204511228 | U | 7/2015 |
| CN | 105178823 | A | 12/2015 |
| JP | 2009046910 | A | 3/2009 |
| JP | 2009114679 | A | 5/2009 |

OTHER PUBLICATIONS

Machine Translation and Abstract of Chinese Publication No. CN101397878, Apr. 1, 2009, 8 pages.
Machine Translation and Abstract of Chinese Publication No. CN104317368, Jan. 28, 2015, 10 pages.
Machine Translation and Abstract of Chinese Publication No. CN105178823, Dec. 23, 2015, 19 pages.
Machine Translation and Abstract of Chinese Publication No. CN202759697, Feb. 27, 2013, 6 pages.
Machine Translation and Abstract of Chinese Publication No. CN204511228, Jul. 29, 2015, 6 pages.
Machine Translation and Abstract of Japanese Publication No. JP2009046910, Mar. 5, 2009, 8 pages.
Machine Translation and Abstract of Japanese Publication No. JP2009114679, May 28, 2009, 16 pages.
Foreign Communication From A Counterpart Application, Chinese Application No. 201510547600.4, Chinese Office Action dated Jun. 27, 2016, 5 pages.
Foreign Communication From A Counterpart Application, PCT Application No. PCT/CN2016/076269, English Translation of International Search Report dated Jun. 20, 2016, 3 pages.

* cited by examiner

Before assembling → After assembling

NOISE REDUCTION DOOR

CROSS-REFERENCE TO RELATED APPLICATIONS

This application is a continuation of International Patent Application No. PCT/CN2016/076269 filed on Mar. 14, 2016, which claims priority to Chinese Patent Application No. 201510547600.4 filed on Aug. 31, 2015. The disclosures of the aforementioned applications are hereby incorporated by reference in their entireties.

TECHNICAL FIELD

The present disclosure relates to the noise reduction field, and in particular, to a noise reduction door.

BACKGROUND

As performance of an information technology (IT) cabinet device is being improved, power consumption is increasingly high. In a conventional air cooling mode, a fan is required to rotate increasingly fast, and consequently, noise is increasingly loud. When the noise is extremely loud, noise damage is caused to a body of a maintenance engineer, and therefore, a noise reduction measure needs to be used on the IT cabinet.

Currently, noise of the cabinet is mainly reduced in a passive manner, that is, using a noise reduction door. That is, one noise reduction door is added both outside a front door and outside a rear door of the cabinet, and a sound absorption material is attached inside the noise reduction door. When an air flow passes through the porous sound absorption material, the air enters a void of the sound absorption material and rubs against a wall of the void. Therefore, sound energy is converted into thermal energy for consumption, and noise energy is reduced. However, a component on the current noise reduction door is fastened to a door plate and is not detachable. Therefore, an air duct of the noise reduction door is fixed, air duct resistance of the noise reduction door is fixed, and the noise reduction door cannot meet a requirement for different noise reduction effects or different air duct resistance.

SUMMARY

Embodiments of the present disclosure provide a noise reduction door in order to resolve a problem that the noise reduction door cannot meet a requirement for different noise reduction effects and different air duct resistance.

To achieve the foregoing objective, the following technical solutions are used in the embodiments of the present disclosure.

According to a first aspect, a noise reduction door is provided, including a T-shaped mechanical part, two fan-shaped mechanical parts, and a door plate, where the T-shaped mechanical part and the fan-shaped mechanical part are connected to the door plate using a detachable connection mechanical part, where the T-shaped mechanical part is located on a central axis of the door plate, and the two fan-shaped mechanical parts are respectively located on two sides of the T-shaped mechanical part.

The door plate includes a sleeve component, the T-shaped mechanical part and the fan-shaped mechanical part each include a cylindrical component, both connection between the door plate and the T-shaped mechanical part and connection between the door plate and the fan-shaped mechanical part are implemented using the sleeve component and the cylindrical components, and a diameter of the cylindrical component is less than a diameter of the sleeve component.

The door plate includes a cylindrical component, the T-shaped mechanical part and the fan-shaped mechanical part each include a sleeve component, both connection between the door plate and the T-shaped mechanical part and connection between the door plate and the fan-shaped mechanical part are implemented using the sleeve component and the cylindrical components, and a diameter of the cylindrical component is less than a diameter of the sleeve component.

A groove is provided inside the sleeve component, that is, a groove is provided on an inner wall of the sleeve component. A spherical component and a spring are disposed on an outer wall of the cylindrical component, the cylindrical component is hollow, the spherical component is connected to one end of the spring, the other end of the spring is fastened to an inner wall of the cylindrical component, and a part of the spherical component is embedded into the groove.

A groove is provided on an outer wall of the cylindrical component, a spherical component and a spring are disposed on an inner wall of the sleeve component, the spherical component is connected to one end of the spring, the other end of the spring is fastened to the inner wall of the sleeve component, and a part of the spherical component is embedded into the groove.

There is at least one groove, and a quantity of spherical components is the same as a quantity of grooves.

An angle between the door plate and a line formed by connecting an end of the T-shaped mechanical part to a closest end of the door plate is less than or equal to 45 degrees.

Materials of the T-shaped mechanical part and the fan-shaped mechanical part are sound absorption materials.

According to a second aspect, a combination of noise reduction doors is provided, including two noise reduction doors according to the first aspect.

The embodiments of the present disclosure provide a noise reduction door, including a T-shaped mechanical part, two fan-shaped mechanical parts, and a door plate. The T-shaped mechanical part and the fan-shaped mechanical part are connected to the door plate using a detachable connection mechanical part. The T-shaped mechanical part is located on a central axis of the door plate, and the two fan-shaped mechanical parts are respectively located on two sides of the T-shaped mechanical part. Therefore, the fan-shaped mechanical part on the door plate may be changed to have different installation positions and installation manners in order to obtain noise reduction doors in different forms and meet a requirement for different noise reduction effects and different air duct resistance.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and persons of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by persons of ordinary skill in the art based on the embodiments of the present disclosure without creative efforts shall fall within the protection scope of the present disclosure.

Figure 1:
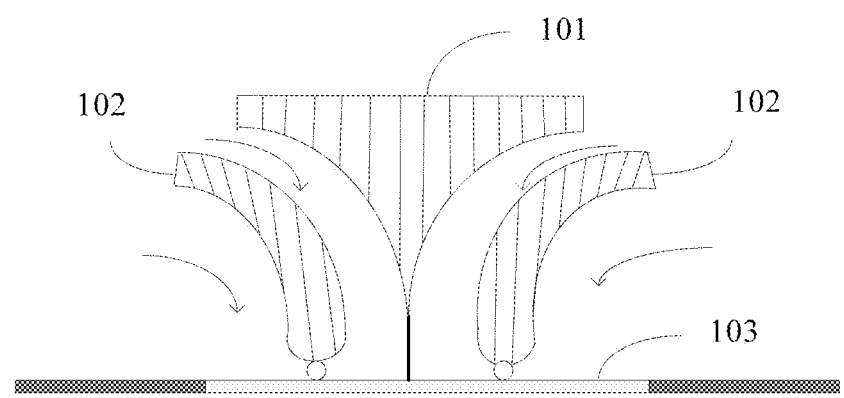
FIG. 1 is a schematic structural diagram of a noise reduction door according to an embodiment of the present disclosure.

An embodiment of the present disclosure provides a noise reduction door. FIG. 1 is a schematic structural diagram of the noise reduction door. The noise reduction door includes a T-shaped mechanical part 101, two fan-shaped mechanical parts 102, and a door plate 103. The T-shaped mechanical part 101 and the fan-shaped mechanical part 102 are connected to the door plate 103 using a detachable connection mechanical part (not shown). The T-shaped mechanical part 101 is located on a central axis of the door plate 103, the two fan-shaped mechanical parts 102 are respectively located on two sides of the T-shaped mechanical part 101, and a direction of an arrow represents a wind direction.

Therefore, an installation position and an installation manner of the fan-shaped mechanical part 102 on the door plate 103 may be changed in order to obtain noise reduction doors in different forms and meet a requirement for different noise reduction effects and different air duct resistance. For example, positions of the left fan-shaped mechanical part 102 and the right fan-shaped mechanical part 102 that are shown in an installation manner (streamlined installation manner) in FIG. 1 may be exchanged in order to obtain an installation effect of a noise reduction door shown in FIG. 2, that is, a schematic structural diagram of another noise reduction door (maze installation manner).

The following describes a manner of connecting between the T-shaped mechanical part 101, the fan-shaped mechanical part 102, and the door plate 103.

Figure 2:
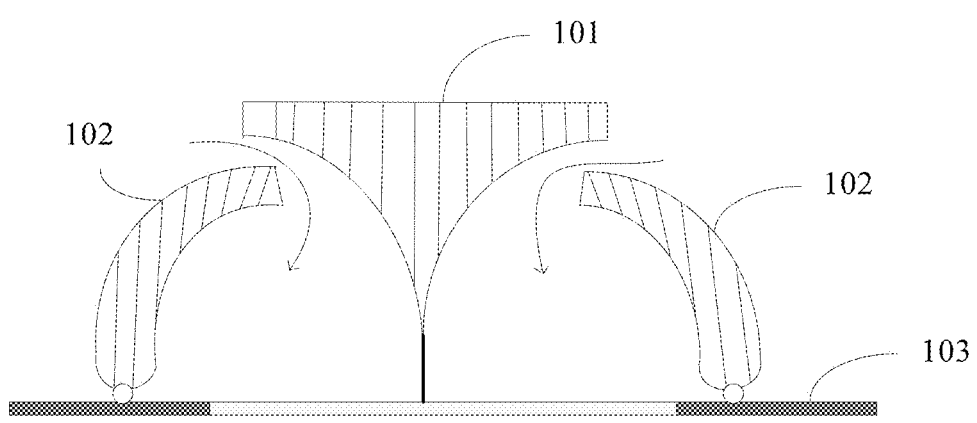
FIG. 2 is a schematic structural diagram of another noise reduction door according to an embodiment of the present disclosure.
Figure 3:
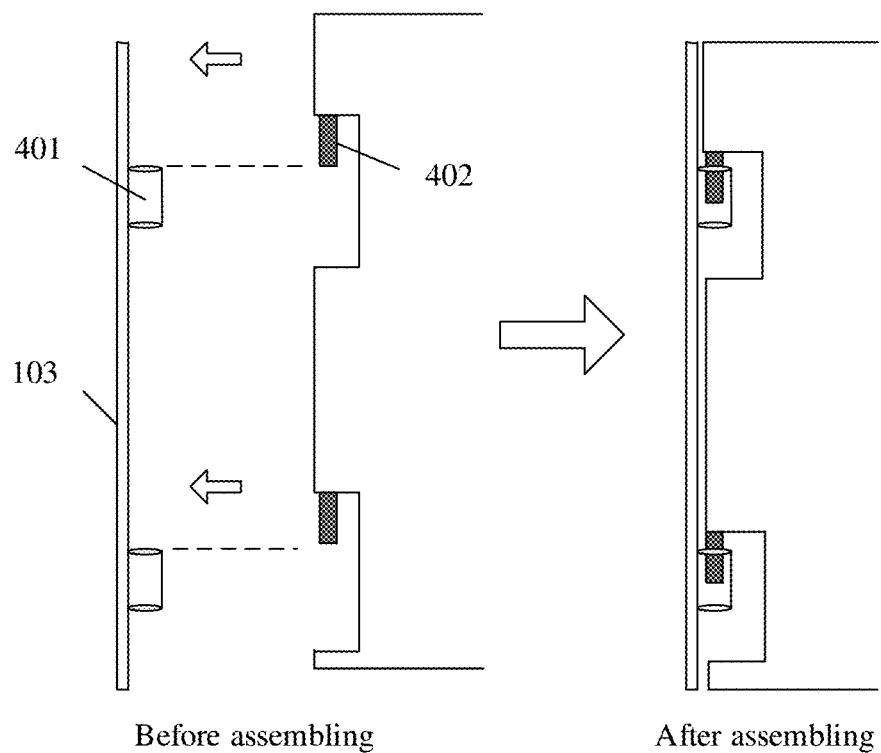
FIG. 3 is a schematic assembly diagram of a door plate, and a T-shaped mechanical part or a fan-shaped mechanical part of a noise reduction door according to an embodiment of the present disclosure.

One connection manner is as follows. For connection between the T-shaped mechanical part 101, the fan-shaped mechanical part 102, and the door plate 103 in FIG. 1 and FIG. 2, FIG. 3 is a schematic assembly diagram of the door plate 103, and the T-shaped mechanical part 101 or the fan-shaped mechanical part 102 of the noise reduction door. The door plate 103 includes a sleeve component 401, and the T-shaped mechanical part 101 and the fan-shaped mechanical part 102 each include a cylindrical component 402. Both connection between the door plate 103 and the T-shaped mechanical part 101 and connection between the door plate 103 and the fan-shaped mechanical part 102 are implemented using sleeve components 401 and cylindrical components 402, and a diameter of the cylindrical component 402 is less than a diameter of the sleeve component 401.

Therefore, the T-shaped mechanical part 101 or the fan-shaped mechanical part 102 may be first lifted upwards until a lower edge of the cylindrical component 402 is higher than an upper edge of the sleeve component 401. The T-shaped mechanical part 101 or the fan-shaped mechanical part 102 is moved nearby the door plate 103 until an axis of the cylindrical component 402 is aligned with an axis of the sleeve component 401. Then, the T-shaped mechanical part 101 or the fan-shaped mechanical part 102 is laid down, and the T-shaped mechanical part 101 or the fan-shaped mechanical part 102 may be installed on the door plate 103.

Materials of the T-shaped mechanical part 101 and the fan-shaped mechanical part 102 may be sound absorption materials such as porous fiber materials. This is not limited in this application.

It may be understood that another connection manner may be as follows. The door plate 103 includes a cylindrical component 402, and the T-shaped mechanical part 101 and the fan-shaped mechanical part 102 each include a sleeve component 401. Both connection between the door plate 103 and the T-shaped mechanical part 101 and connection between the door plate 103 and the fan-shaped mechanical part 102 are implemented using sleeve components 401 and cylindrical components 402, and a diameter of the cylindrical component 402 is less than a diameter of the sleeve component 401. Therefore, when being connected and installed, the door plate 103 may be lifted upwards, and the cylindrical component 402 on the door plate 103 is inserted into the sleeve component 401 of the T-shaped mechanical part 101 or the fan-shaped mechanical part 102.

Figure 4:
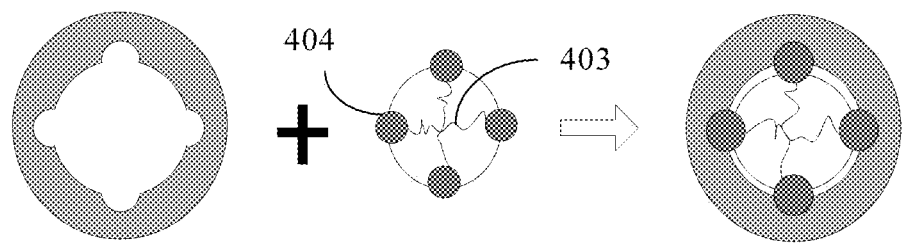
FIG. 4 is a schematic structural diagram of a cylindrical component and a sleeve component on a noise reduction door according to an embodiment of the present disclosure.

As shown in FIG. 4, for a purpose of reliably installing the T-shaped mechanical part 101 and the fan-shaped mechanical part 102 on the door plate 103, a groove is provided on an inner wall of the sleeve component 401, a spherical component 404 and a spring 403 are disposed on an outer wall of the cylindrical component 402, and the cylindrical component 402 is hollow. The spherical component 404 is connected to one end of the spring 403, the other end of the spring 403 is fastened to an inner wall of the cylindrical component 402, and a part of the spherical component 404 is embedded into the groove, that is, a part of the spherical component 404 protrudes from the wall of the cylindrical component 402.

That is, there is a groove on the sleeve component 401, and it is equivalent to the fact that there is a small elastic ball on the cylindrical component 402. That is, the small ball on the cylindrical component 402 is connected to one end of the spring 403, and the other end of the spring 403 is fastened to the inner wall of the cylindrical component 402. When the cylindrical component 402 is inserted in the sleeve component 401, after external force is applied, the small ball on the cylindrical component 402 retracts into the cylindrical component 402. The T-shaped mechanical part 101 or the fan-shaped mechanical part 102 is rotated, and when a position of the small ball is aligned with that of the groove inside the sleeve component 401, the small ball pops up in order to achieve a position limiting function.

It may be understood that, alternatively, a groove may be provided on an outer wall of the cylindrical component 402, a spherical component and a spring are disposed on an inner wall of the sleeve component 401. The spherical component is connected to one end of the spring, the other end of the spring is fastened to the inner wall of the sleeve component 401, and a part of the spherical component is embedded into the groove.

In addition, herein, there may be at least one groove, and a quantity of spherical components is the same as a quantity of grooves. Therefore, when an angle of the fan-shaped mechanical part 102 needs to be changed, only the fan-shaped mechanical part 102 needs to be forcibly rotated. If force applied to the spherical component reaches a value, the spherical component retracts into the cylindrical component 402 or the sleeve component 401, and the angle of the fan-shaped mechanical part 102 is adjusted until an appropriate angle is obtained. For example, the spherical component is rotated to another adjacent groove. For example, there is a groove on the sleeve component 401, there is a spherical component with a spring on the cylindrical component 402, and when a quantity of grooves is 4 and a quantity of spherical components is 4, a cross sectional diagram obtained after the cylindrical component 402 is inserted into the sleeve component 401 is shown in FIG. 4. That is, FIG. 4 is a schematic structural diagram that is of the cylindrical component 402 and the sleeve component 401 and that is obtained after the T-shaped mechanical part 101 and the fan-shaped mechanical part 102 in FIG. 1 to FIG. 3 are connected to the door plate 103 using the cylindrical components 402 and the sleeve components 401.

Further, after components of two groups of noise reduction doors are manufactured using a same mold, a combination of noise reduction doors is obtained, and therefore, manufacturing costs may be reduced.

Still further, after the combination of the noise reduction doors is obtained, noise reduction doors in different forms may be obtained by changing an installation position and an installation manner of the fan-shaped mechanical part 102 according to different resistance requirements and different noise reduction requirements of a cabinet system in order to meet a requirement for different noise reduction effects and different air duct resistance.

An effect diagram obtained after the combination of the noise reduction doors is installed on a cabinet may be shown in FIG. 5 to FIG. 8 (it is assumed that a fan 502 of a cabinet 501 is located at an air exhaust vent, that is, at a rear door), and a direction of an arrow represents a wind direction.

Figure 5:
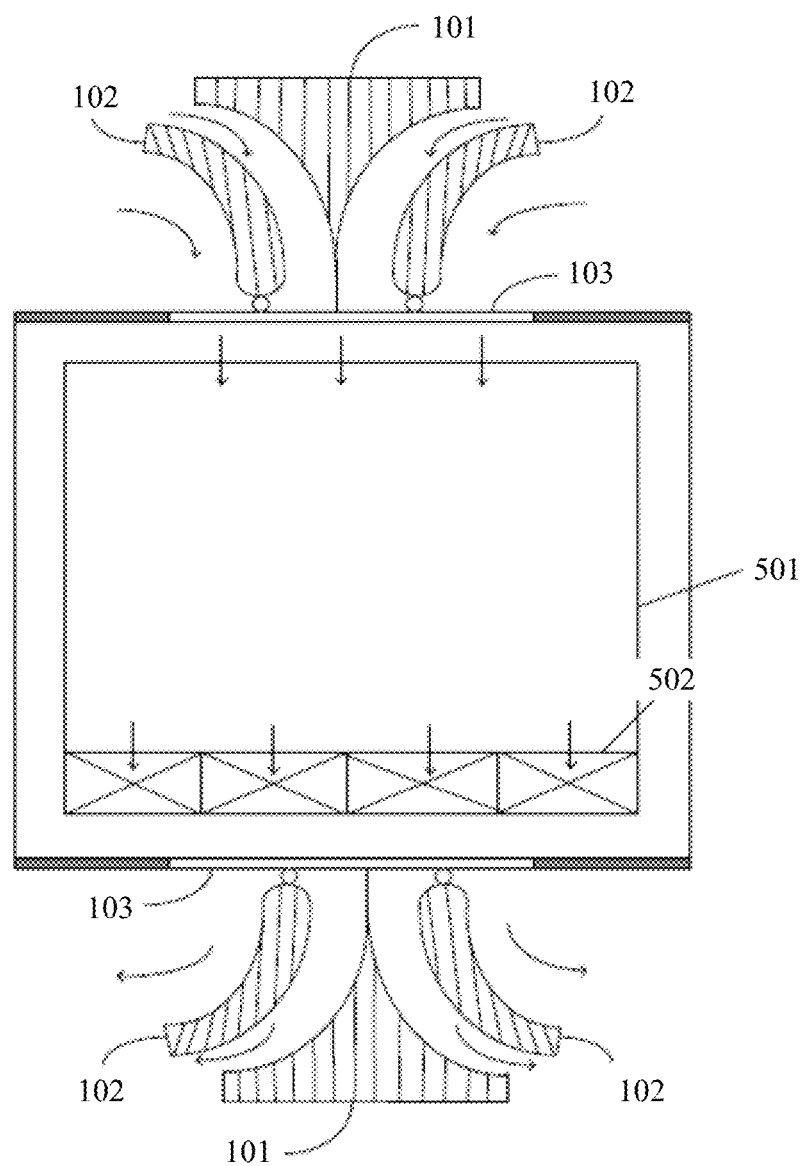
FIG. 5 is a schematic structural diagram of a combination of a cabinet and a noise reduction door according to an embodiment of the present disclosure.

Further, as shown in FIG. 5, both a runner of a noise reduction door at an air intake vent (at a front door) and a runner of a noise reduction door at an air exhaust vent are streamlined, and therefore, the resistance is low. This is applicable to a scenario in which low wind resistance of the noise reduction door is required.

Figure 6:
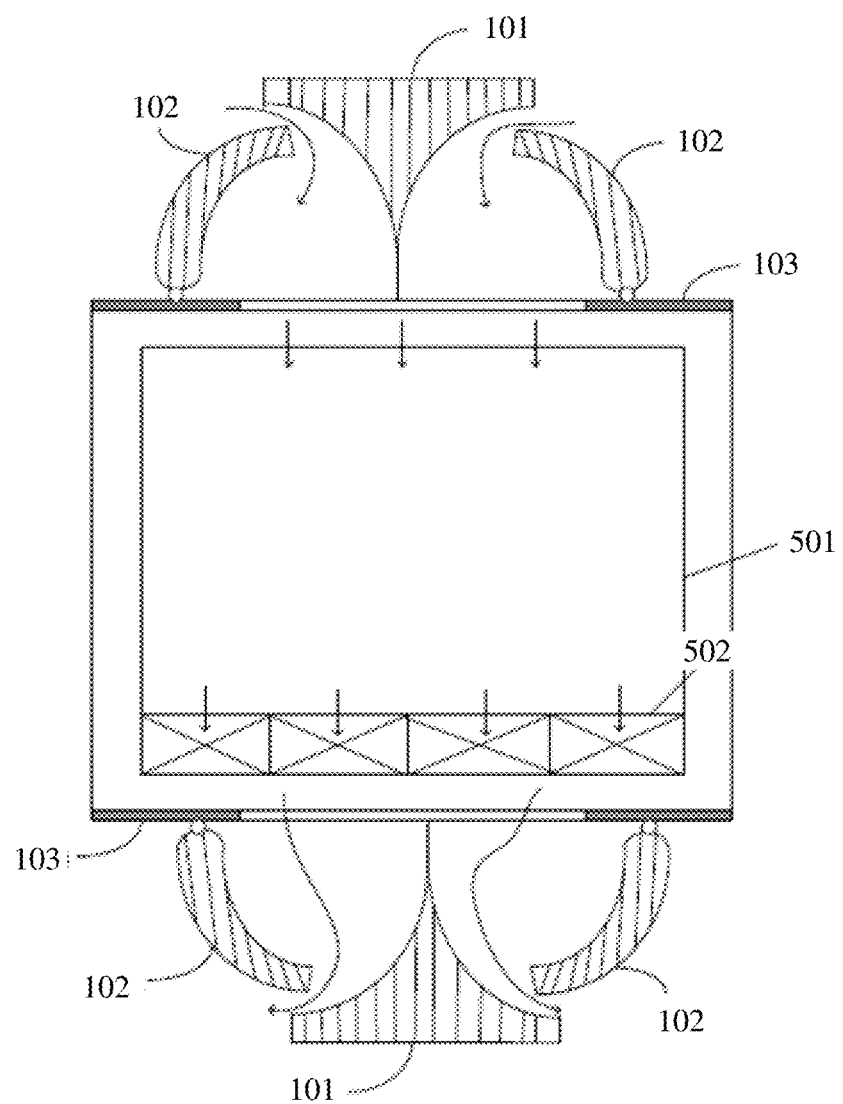
FIG. 6 is a schematic structural diagram of another combination of a cabinet and a noise reduction door according to an embodiment of the present disclosure.

As shown in FIG. 6, both a runner of a noise reduction door at an air intake vent and a runner of a noise reduction door at an air exhaust vent are in a form of a maze, and therefore, a desirable noise reduction effect is achieved. This is applicable to a scenario in which an obvious noise reduction effect of the noise reduction door is required.

Figure 7:
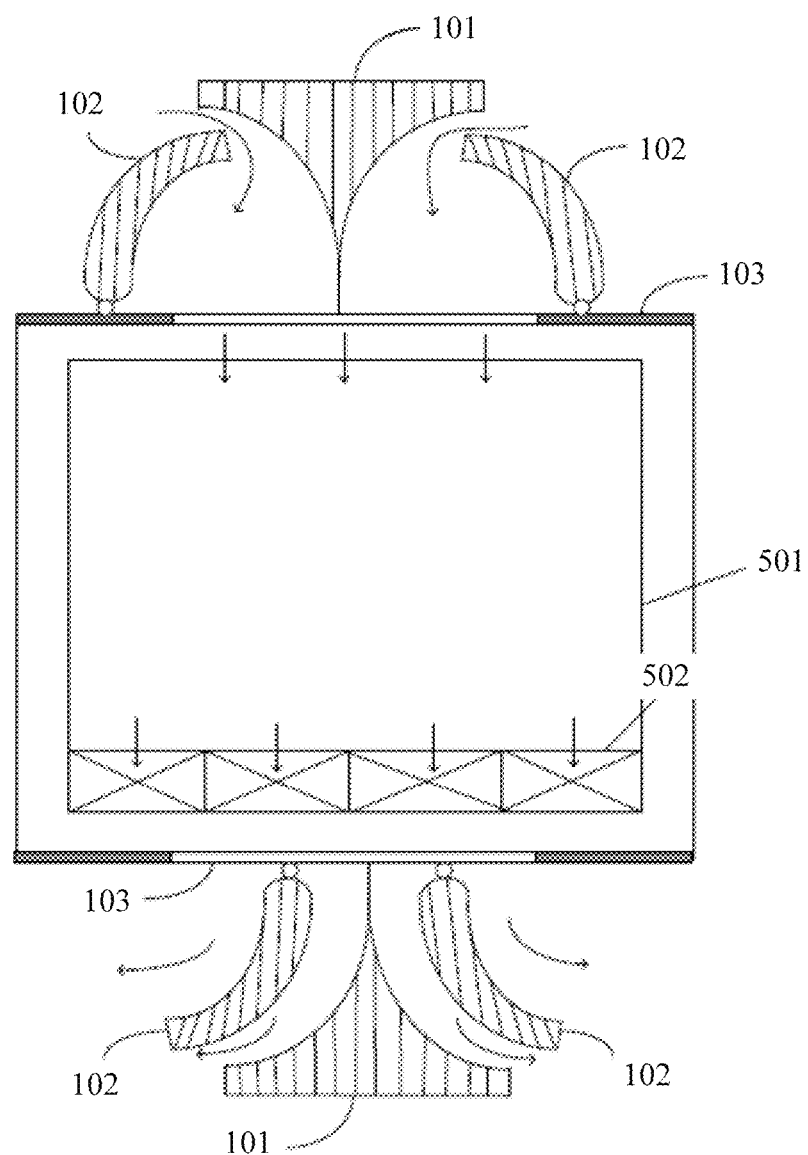
FIG. 7 is a schematic structural diagram of still another combination of a cabinet and a noise reduction door according to an embodiment of the present disclosure.

As shown in FIG. 7, a runner of a noise reduction door at an air intake vent is in a form of a maze, and a runner of a noise reduction door at an air exhaust vent is streamlined. This is applicable to a scenario in which a relatively desirable noise reduction effect and relatively low wind resistance are required.

Figure 8:
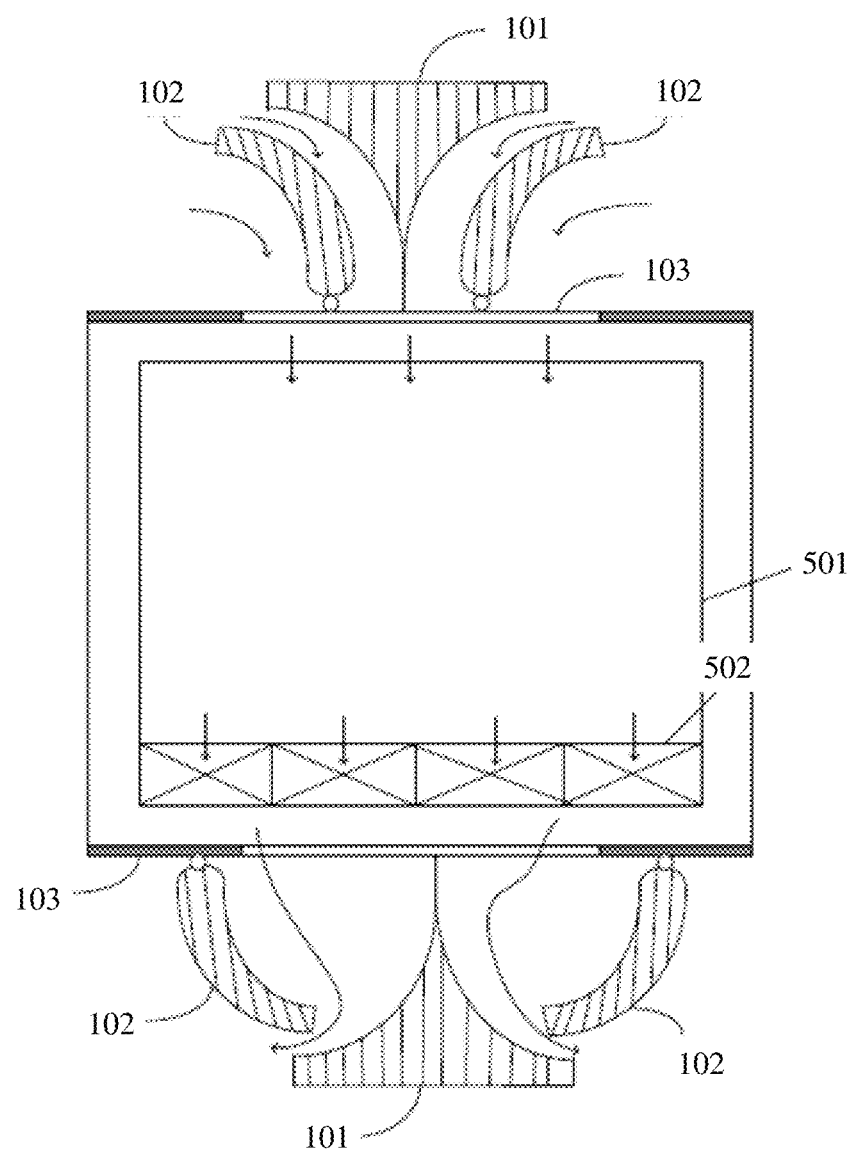
FIG. 8 is a schematic structural diagram of still another combination of a cabinet and a noise reduction door according to an embodiment of the present disclosure.

As shown in FIG. 8, a runner of a noise reduction door at an air intake vent is streamlined, and a runner of a noise reduction door at an air exhaust vent is in a form of a maze. This is applicable to a scenario in which low wind resistance and a relatively small noise reduction effect are required.

Because wind at the air exhaust vent diffuses towards two sides, when an operator is performing an operation at the rear door, neither an air flow nor noise diffuses towards the operator, thereby achieving desirable operation experience.

Figure 9:
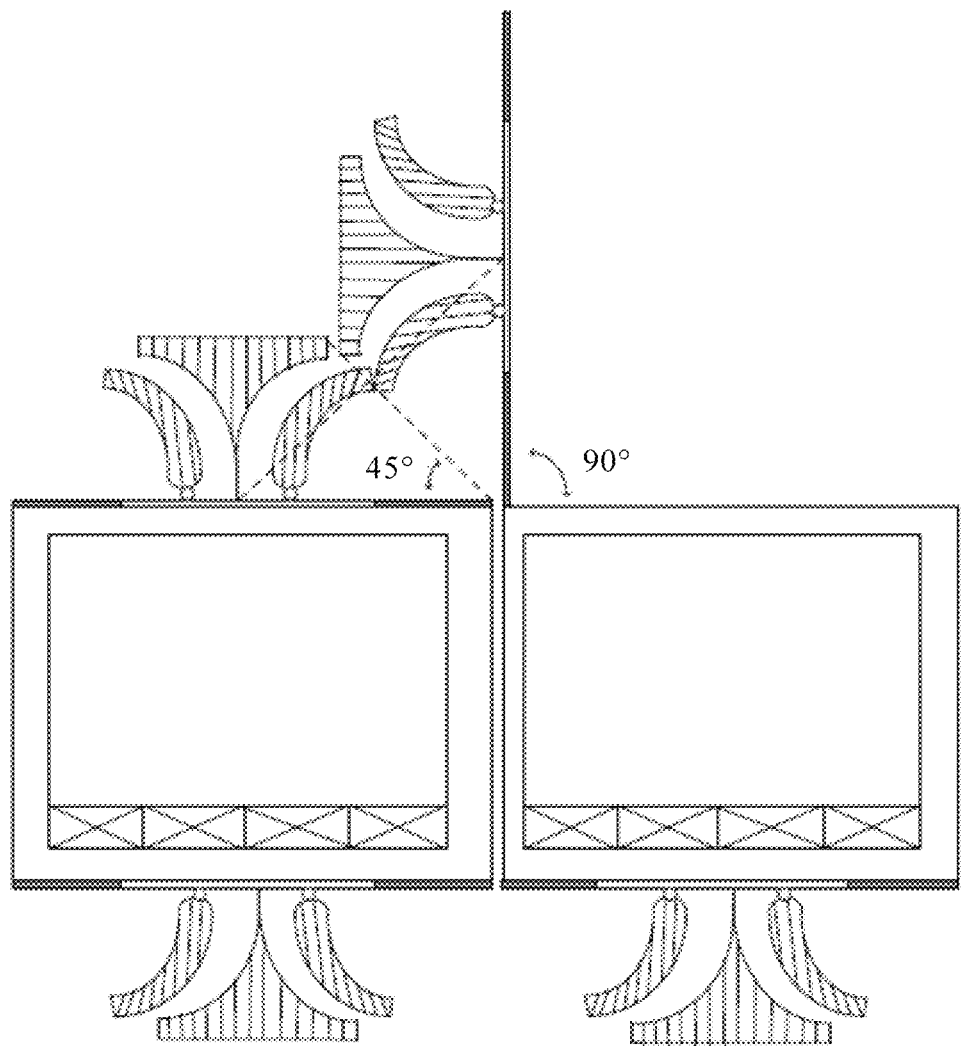
FIG. 9 is a schematic structural diagram of a combined cabinet with one noise reduction door open according to an embodiment of the present disclosure.

When cabinets on which noise reduction doors in the present disclosure are installed are combined, one noise reduction door needs to be opened. If only one person is required to perform maintenance, an open angle of the door may be 90 degrees. In this case, an angle between the door plate 103 and a line formed by connecting an end of the T-shaped mechanical part 101 to a closest end of the door plate 103 may be 45 degrees, and an effect diagram obtained after the door is opened may be shown in FIG. 9. Certainly, alternatively, the angle may be less than 45 degrees.

Figure 10:
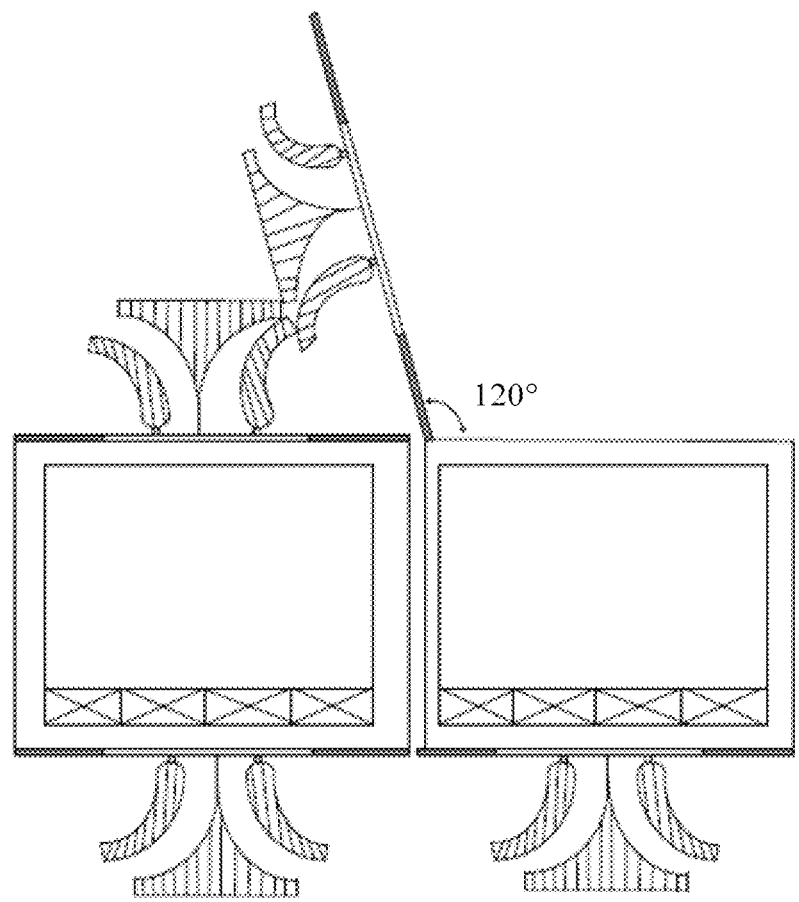
FIG. 10 is a schematic structural diagram of another combined cabinet with one noise reduction door open according to an embodiment of the present disclosure.

If two persons are required to perform maintenance and an open angle of a door may reach 120 degrees or be another angle, a right fan-shaped mechanical part of a left noise reduction door may be rotated by an appropriate angle, such that an open angle of the right noise reduction door may be 120 degrees or another angle, as shown in FIG. 10 in order to facilitate maintenance by the two persons.

Figure 11:
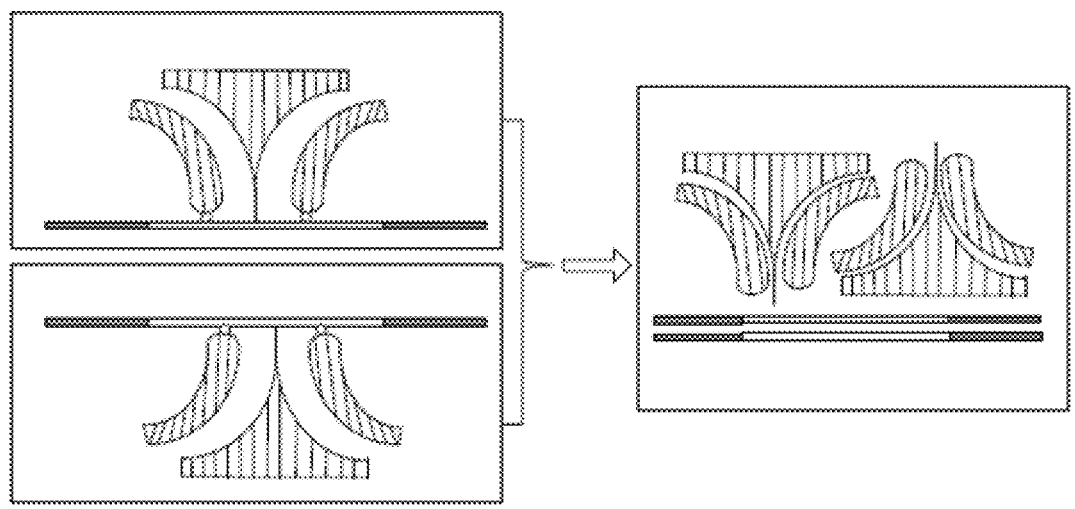
FIG. 11 is a schematic diagram of packaging a combination of noise reduction doors according to an embodiment of the present disclosure.

When the noise reduction door is being packaged for transportation, four parts of the noise reduction door may be detached for packaging, such that a packaging volume can be reduced and transportation costs can be reduced. As shown in FIG. 11, two original packages (in a left schematic diagram) are combined into one package (in a right schematic diagram) in order to reduce a packaging volume.

The foregoing descriptions are merely implementation manners of the present disclosure, but are not intended to limit the protection scope of the present disclosure. Any variation or replacement readily figured out by persons skilled in the art within the technical scope disclosed in the present disclosure shall fall within the protection scope of the present disclosure. Therefore, the protection scope of the present disclosure shall be subject to the protection scope of the claims.

Finally, it should be noted that the foregoing embodiments are merely intended for describing the technical solutions of the present disclosure but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present disclosure.

What is claimed is:
1. A noise reduction door, comprising:
   a door plate;
   a T-shaped mechanical part detachably connected to a central axis of the door plate; and two fan-shaped mechanical parts detachably connected to the door plate and respectively located on two sides of the T-shaped mechanical part, wherein the two fan-shaped mechanical parts comprise a curved surface, and wherein the two fan-shaped mechanical parts are rotatable about an axis where connected to the door plate.

2. The noise reduction door according to claim 1, wherein the door plate comprises sleeve components, wherein the T-shaped mechanical part and the two fan-shaped mechanical parts each comprise a cylindrical component, wherein a connection between the door plate and the T-shaped mechanical part and a connection between the door plate and the two fan-shaped mechanical parts are implemented using the sleeve components and cylindrical components, and wherein a diameter of a cylindrical component of the T-shaped mechanical part is less than a diameter of a sleeve component.

3. The noise reduction door according to claim 1, wherein the door plate comprises sleeve components, wherein the T-shaped mechanical part and the two fan-shaped mechanical parts each comprise a cylindrical component, wherein a connection between the door plate and the T-shaped mechanical part and a connection between the door plate and the two fan-shaped mechanical parts are implemented using the sleeve components and cylindrical components, and wherein a diameter of a cylindrical component of a fan-shaped mechanical part is less than a diameter of a sleeve component.

4. The noise reduction door according to claim 1, wherein the door plate comprises cylindrical components, wherein the T-shaped mechanical part and the two fan-shaped mechanical parts each comprise a sleeve component, wherein a connection between the door plate and the T-shaped mechanical part and a connection between the door plate and the two fan-shaped mechanical parts are implemented using sleeve components and the cylindrical components, and wherein a diameter of a sleeve component of the T-shaped mechanical part is greater than a diameter of a cylindrical component.

5. The noise reduction door according to claim 1, wherein the door plate comprises cylindrical components, wherein the T-shaped mechanical part and the two fan-shaped mechanical parts each comprise a sleeve component, wherein a connection between the door plate and the T-shaped mechanical part and a connection between the door plate and the two fan-shaped mechanical parts are implemented using sleeve components and the cylindrical components, and wherein a diameter of a sleeve component of a fan-shaped mechanical part is greater than a diameter of a cylindrical component.

6. The noise reduction door according to claim 2, wherein a groove is provided on an inner wall of a sleeve component, wherein a spherical component and a spring are disposed on an outer wall of the cylindrical component, wherein the cylindrical component is hollow, wherein the spherical component is connected to one end of the spring, wherein the other end of the spring is fastened to an inner wall of the cylindrical component, and wherein a part of the spherical component is embedded into the groove.

7. The noise reduction door according to claim 3, wherein a groove is provided on an inner wall of a sleeve component, wherein a spherical component and a spring are disposed on an outer wall of the cylindrical component, wherein the cylindrical component is hollow, wherein the spherical component is connected to one end of the spring, wherein the other end of the spring is fastened to an inner wall of the cylindrical component, and wherein a part of the spherical component is embedded into the groove.

8. The noise reduction door according to claim 4, wherein a groove is provided on an inner wall of the sleeve component, wherein a spherical component and a spring are disposed on an outer wall of a cylindrical component, wherein the cylindrical component is hollow, wherein the spherical component is connected to one end of the spring, wherein the other end of the spring is fastened to an inner wall of the cylindrical component, and wherein a part of the spherical component is embedded into the groove.

9. The noise reduction door according to claim 5, wherein a groove is provided on an inner wall of the sleeve component, wherein a spherical component and a spring are disposed on an outer wall of a cylindrical component, wherein the cylindrical component is hollow, wherein the spherical component is connected to one end of the spring, wherein the other end of the spring is fastened to an inner wall of the cylindrical component, and wherein a part of the spherical component is embedded into the groove.

10. The noise reduction door according to claim 2, wherein a groove is provided on an outer wall of the cylindrical component, wherein a spherical component and a spring are disposed on an inner wall of a sleeve component, wherein the spherical component is connected to one end of the spring, wherein the other end of the spring is fastened to the inner wall of the sleeve component, and wherein a part of the spherical component is embedded into the groove.

11. The noise reduction door according to claim 3, wherein a groove is provided on an outer wall of the cylindrical component, wherein a spherical component and a spring are disposed on an inner wall of a sleeve component, wherein the spherical component is connected to one end of the spring, wherein the other end of the spring is fastened to the inner wall of the sleeve component, and wherein a part of the spherical component is embedded into the groove.

12. The noise reduction door according to claim 4, wherein a groove is provided on an outer wall of a cylindrical component, wherein a spherical component and a spring are disposed on an inner wall of the sleeve component, wherein the spherical component is connected to one end of the spring, wherein the other end of the spring is fastened to the inner wall of the sleeve component, and wherein a part of the spherical component is embedded into the groove.

13. The noise reduction door according to claim 6, further comprising at least one groove, and wherein a quantity of spherical components is the same as a quantity of grooves.

14. The noise reduction door according to claim 8, further comprising at least one groove, and wherein a quantity of spherical components is the same as a quantity of grooves.

15. The noise reduction door according to claim 10, further comprising at least one groove, and wherein a quantity of spherical components is the same as a quantity of grooves.

16. The noise reduction door according to claim 12, further comprising at least one groove, and wherein a quantity of spherical components is the same as a quantity of grooves.

17. The noise reduction door according to claim 1, wherein an angle between the door plate and a line formed by connecting an end of the T-shaped mechanical part to a closest end of the door plate is less than 45 degrees.

18. The noise reduction door according to claim 1, wherein an angle between the door plate and a line formed by connecting an end of the T-shaped mechanical part to a closest end of the door plate is equal to 45 degrees.

19. The noise reduction door according to claim 1, wherein materials of the T-shaped mechanical part and the two fan-shaped mechanical parts are sound absorption materials.

20. A combination of noise reduction doors, wherein the combination of the noise reduction doors comprises two noise reduction doors, and wherein each noise reduction door comprises:
 a door plate;
 a T-shaped mechanical part detachable connected to a central axis of the door plate; and
 two fan-shaped mechanical parts detachably connected to the door plate and respectively located on two sides of the T-shaped mechanical part, wherein the two fan-shaped mechanical parts comprise a curved surface, and wherein the two fan-shaped mechanical parts are rotatable about an axis where connected to the door plate.

* * * * *

UNITED STATES PATENT AND TRADEMARK OFFICE
CERTIFICATE OF CORRECTION

PATENT NO. : 10,822,865 B2
APPLICATION NO. : 15/814071
DATED : November 3, 2020
INVENTOR(S) : Yaofeng Peng et al.

It is certified that error appears in the above-identified patent and that said Letters Patent is hereby corrected as shown below:

In the Claims

Claim 20, Column 9, Line 12: "part detachable connected" should read "part detachably connected"

Signed and Sealed this
Twenty-second Day of December, 2020

Andrei Iancu
*Director of the United States Patent and Trademark Office*